(12) United States Patent  
Diaz

(10) Patent No.: US 8,025,515 B2
(45) Date of Patent: Sep. 27, 2011

(54) SYSTEMS AND METHODS FOR CONNECTING A CIRCUIT BOARD WITH A CHASSIS

(75) Inventor: Randall J. Diaz, Gilroy, CA (US)

(73) Assignee: Ericsson AB, Stockholm (SE)

( * ) Notice: Subject to any disclaimer, the term of this patent is extended or adjusted under 35 U.S.C. 154(b) by 189 days.

(21) Appl. No.: 12/069,256

(22) Filed: Feb. 8, 2008

(65) Prior Publication Data
US 2009/0201642 A1 Aug. 13, 2009

(51) Int. Cl.
*H01R 13/64* (2006.01)
(52) U.S. Cl. .................... 439/248; 361/727
(58) Field of Classification Search .......... 439/247, 439/248; 361/727, 737, 752, 756, 788, 790, 361/800
See application file for complete search history.

(56) References Cited

U.S. PATENT DOCUMENTS

| | | | |
|---|---|---|---|
| 5,311,408 A | 5/1994 | Ferchau et al. | |
| 5,478,259 A * | 12/1995 | Noschese | 439/607.31 |
| 5,654,873 A * | 8/1997 | Smithson et al. | 361/679.37 |
| 5,993,241 A * | 11/1999 | Olson et al. | 439/378 |
| 6,078,504 A * | 6/2000 | Miles | 361/727 |
| 6,239,984 B1 * | 5/2001 | Koradia et al. | 361/784 |
| 6,274,807 B1 * | 8/2001 | Pommerenke et al. | 174/384 |
| 6,351,394 B1 * | 2/2002 | Cunningham | 361/818 |
| 6,457,949 B1 * | 10/2002 | Bendikas et al. | 417/360 |
| 6,483,709 B1 * | 11/2002 | Layton | 361/724 |
| 6,775,143 B2 * | 8/2004 | Yen et al. | 361/727 |
| 7,083,422 B2 * | 8/2006 | Campini et al. | 439/61 |
| 7,164,581 B2 * | 1/2007 | Carullo et al. | 361/679.48 |

* cited by examiner

*Primary Examiner* — Thanh Tam Le
(74) *Attorney, Agent, or Firm* — Blakely Sokoloff Taylor & Zafman, LLP

(57) ABSTRACT

Systems and methods for connecting a circuit board, such as a circuit board of a fan tray, with a chassis are described herein. Systems and methods for floating, aligning, centering, grounding and blind-mating a connector set are also described herein.

23 Claims, 12 Drawing Sheets

SYSTEMS AND METHODS FOR CONNECTING A CIRCUIT BOARD WITH A CHASSIS

FIELD

Embodiments of this invention relate to the field of computer systems and, in particular, to systems and methods for connecting a printed circuit board (PCB) associated with a field replaceable unit (FRU) with a backplane of a chassis.

BACKGROUND

Computer systems include a housing, often referred to as a chassis, on which the computer system's components are mounted. One such computer system is a server rack that typically includes several printed circuit boards (PCBs) to provide needed computing requirements. For example, some computer systems or servers have several PCBs to provide users with triple-play services, such as HDTV (high definition television), HDVoD (high definition voice on demand), and broadband mobility, all within one housing.

These PCBs provided in the chassis of the server rack are connected to one another and are typically powered by a single power source connector within the chassis. This power source is typically provided on a backplane. These PCBs generate a significant amount of heat, which can damage or reduce the efficiency of the PCBs. As a result, the chassis is often provided with a fan unit to remove this heat from the chassis.

The fan unit itself typically includes several fans and a circuit board to control operation of and provide power to the fans. The fan unit also includes a connector to couple the fan unit's circuit board with the backplane of the chassis to power the fan unit through the fan unit's circuit board.

SUMMARY

Systems and methods for connecting a circuit board, such as a fan unit's circuit board, with a chassis are described herein. Systems and methods for floating, aligning, centering, grounding and blind-mating a connector set are also described herein.

In one embodiment, the system includes a chassis having a first connector; a field replaceable unit (FRU), such as a fan unit, insertable into the chassis; an interface coupled with the FRU; a second connector coupled with the interface, the second connector coupleable with the first connector; a vertical spring coupled with the interface to provide vertical resilience to the second connector; and a horizontal spring coupled with the interface to provide horizontal resilience to the second connector.

Other features of the present invention will be apparent from the accompanying drawings and from the detailed description which follows.

BRIEF DESCRIPTION OF THE DRAWINGS

The invention is described by way of example with reference to the accompanying drawings, wherein.

DETAILED DESCRIPTION

An interface that includes a support, a first connector of a connector set, a vertical spring and a horizontal spring is disclosed herein. The interface allows for floating, aligning, centering, grounding and blind-mating a connector set. In one embodiment, the support of the interface is a printed circuit board (PCB) of a field replaceable unit (FRU), such as a fan unit. The FRU is insertable into a chassis. A second connector of the connector set is provided within the chassis. When the FRU is inserted into the chassis, the first connector and the second connector of the connector set are connected together.

The interface acts to take the assembly weight of the FRU off a mated connector set, while at the same time providing a constant grounding electrical path to the chassis from one or both sides of the connector set's printed circuit board (PCB). In one embodiment, the interface also allows the first connector to float or freely move or translate. In one embodiment, the interface also allows left-to-right (e.g., horizontal) and up-down (e.g., vertical) resilience of the first connector via the horizontal spring and vertical spring, respectively.

The interface also allows for the use of any size connector or multiple connectors to be used on the interface. The interface can also eliminate the need for a harness and connector set combination as required by an off-the-shelf or commercially available orthogonal panel-mounted connector. The interface also reduces tolerance build-up for chassis mounting by reducing assembly elements situated between connectors and FRU-chassis mating surfaces or datums.

Figure 1:
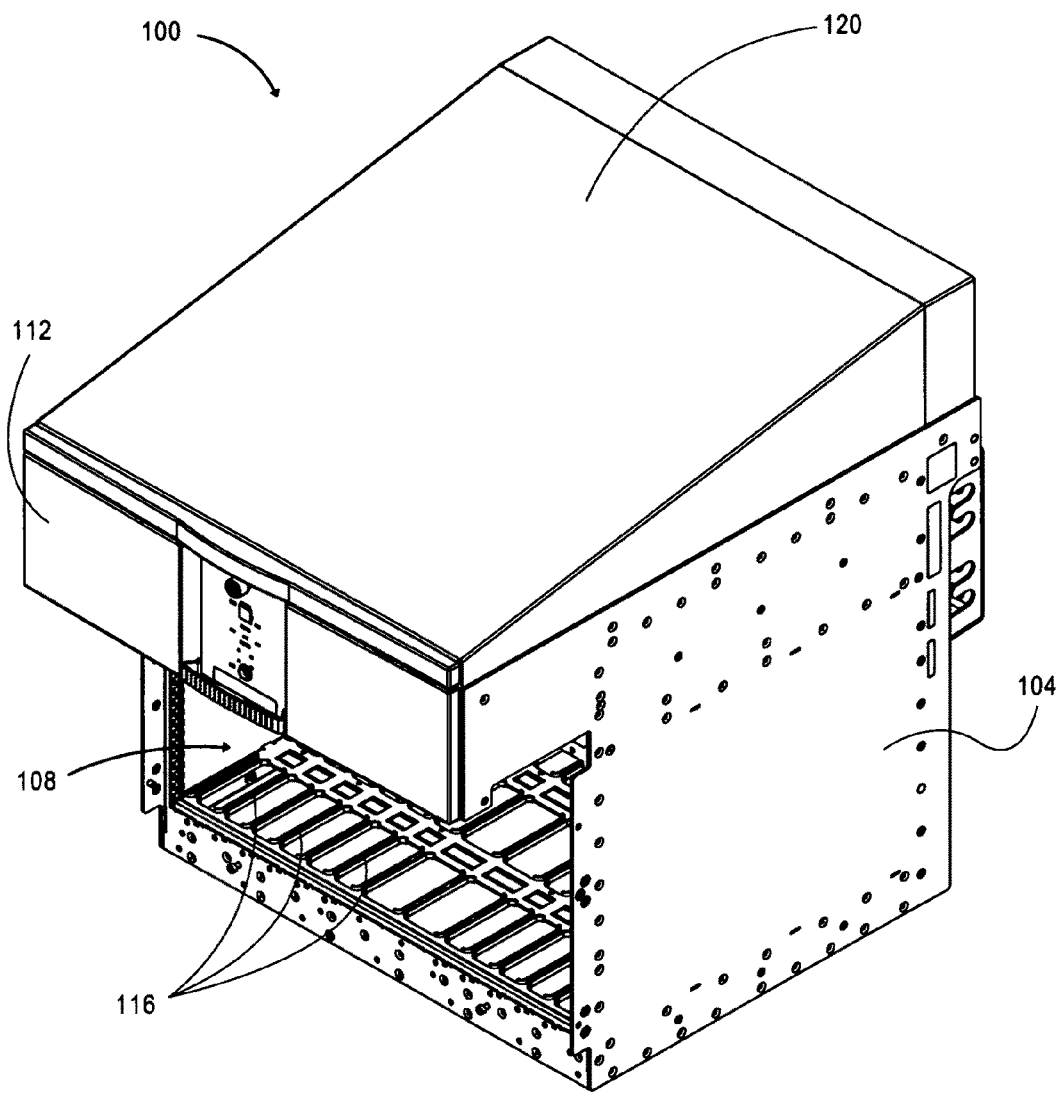
FIG. 1 is a front perspective view of a chassis in accordance with one embodiment of the invention.
Figure 2:
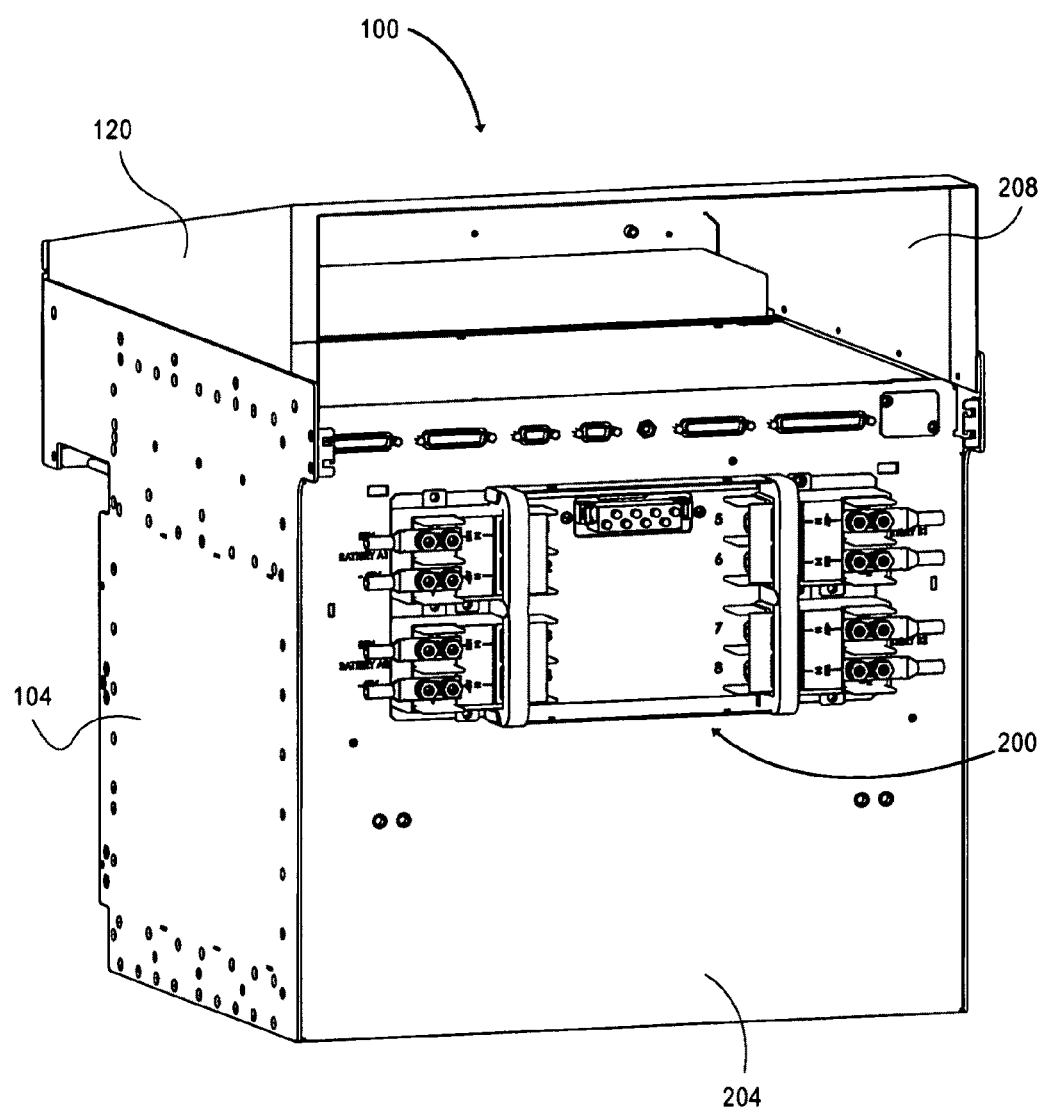
FIG. 2 is a rear perspective view of the chassis of FIG. 1 in accordance with one embodiment of the invention.

FIGS. 1 and 2 illustrate a chassis 100 of a computer system in accordance with one embodiment of the invention. The illustrated chassis 100 is a network router. For example, the chassis 100 may be a network router for providing HDTV, HDVoD and broadband mobility to several users that can be connected with the computer system. It will be appreciated that the chassis 100 is not limited to the illustrated embodiment. It will also be appreciated that the chassis 100 can be used with computer servers. The chassis may be any housing of an electrically connected system that provides a framework in or on which components of the electrically connected system are mounted.

With reference to FIG. 1, the chassis 100 includes an enclosure 104 having a first opening 108 and a second opening (not shown). The first opening 108 is configured to receive a plurality of PCBs (not shown) at PCB card guides 116.

In FIG. 1, a fan unit 112 is provided in the second opening (covering the second opening). The fan unit 112 is configured to remove heat from the PCBs.

A hood 120 is also provided on a top surface of the enclosure 104. The hood 120 is in communication with the fan unit 112 to exhaust the heat removed from the PCBs by the fan unit 112.

As shown in FIG. 2, electronic devices 200 are provided on an external surface 204 of the chassis 100. The electronic devices 200 allow for power connection with the components of the computer system through the chassis. The electronic devices 200 may include, for example, switches, connectors, a PCB and the like. It will be appreciated that the electronic devices 200 provided on the chassis may vary depending on the application of the computer system.

Also, as shown in FIG. 2, the hood 120 includes an opening 208. With reference to FIGS. 1 and 2, the hood 120 is coupled with the enclosure 104 and the fan unit 112 to provide an air flow path from within the enclosure 104 to an area external to the chassis 100 through the opening 208. Thus, the heat generated by the PCBs within the first opening 108 can be removed by the fan unit 112 through the hood 120 and opening 208 to an environment external the chassis 100.

Figure 3:
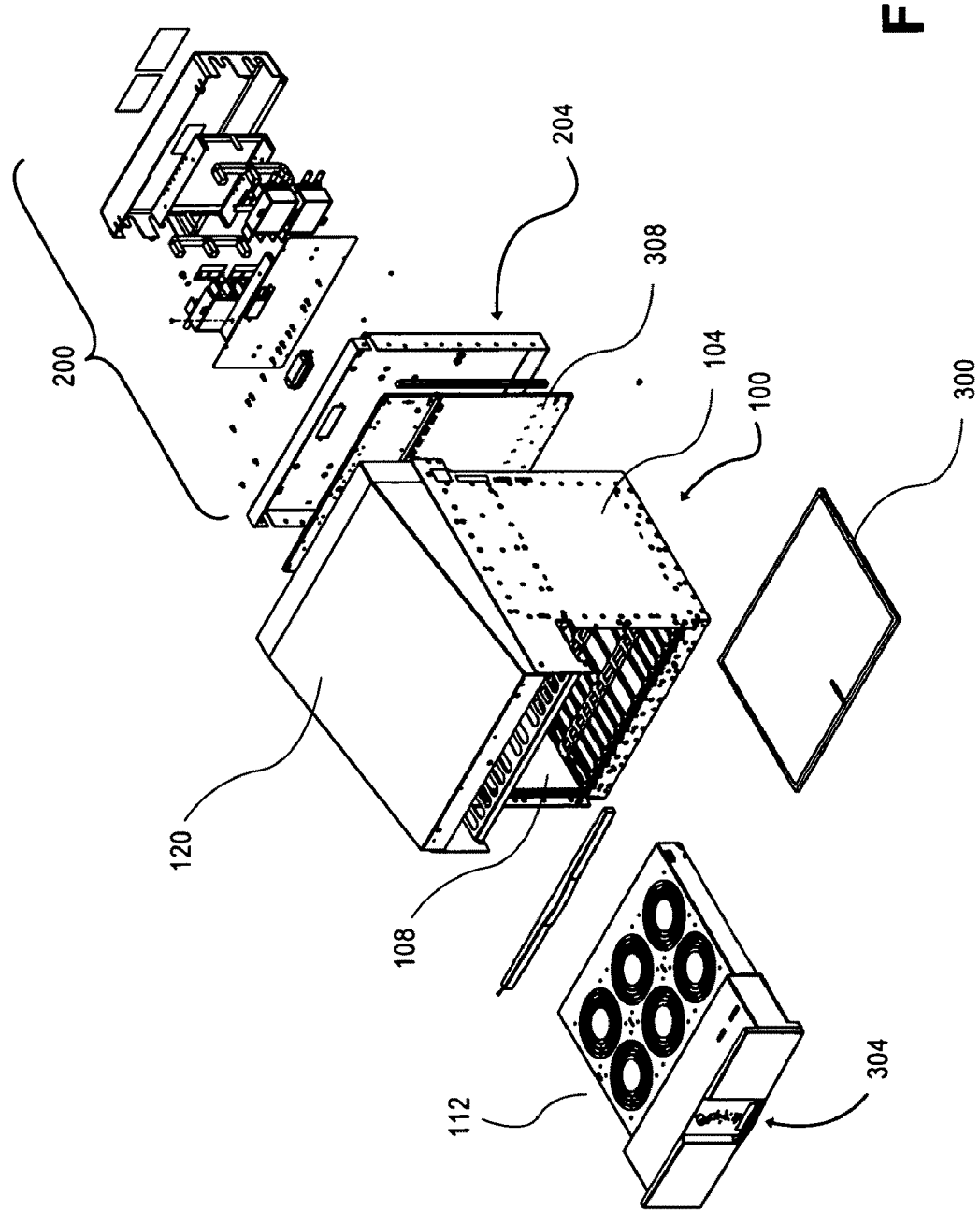
FIG. 3 is a perspective assembly view of the chassis of FIG. 1 in accordance with one embodiment of the invention.

FIG. 3 is an assembly view of the chassis of FIG. 1 illustrating the enclosure 104, first and second openings 108, PCB card guides 116, fan unit 112 and hood 120 in further detail. FIG. 3 also illustrates the electronic devices 200 of FIG. 2 in further detail. As shown in FIG. 3, the chassis 100 also includes an air filter 300, a display panel 304, and a backplane 308.

The air filter 300 is configured to filter air within the enclosure 104. In one embodiment, the air filter 300 is a removable air filter.

The display panel 304 may include indicators, such as LEDs or the like, that provide operating information within the chassis to a user observing the chassis.

The backplane 308 is configured to interconnect the PCBs in the first opening 108 of the enclosure 104. The backplane 308 is also configured to connect with the fan unit 112 through a PCB provided in the fan unit 112. The backplane 308 is also configured to power one or more of the PCBs.

Figure 4:
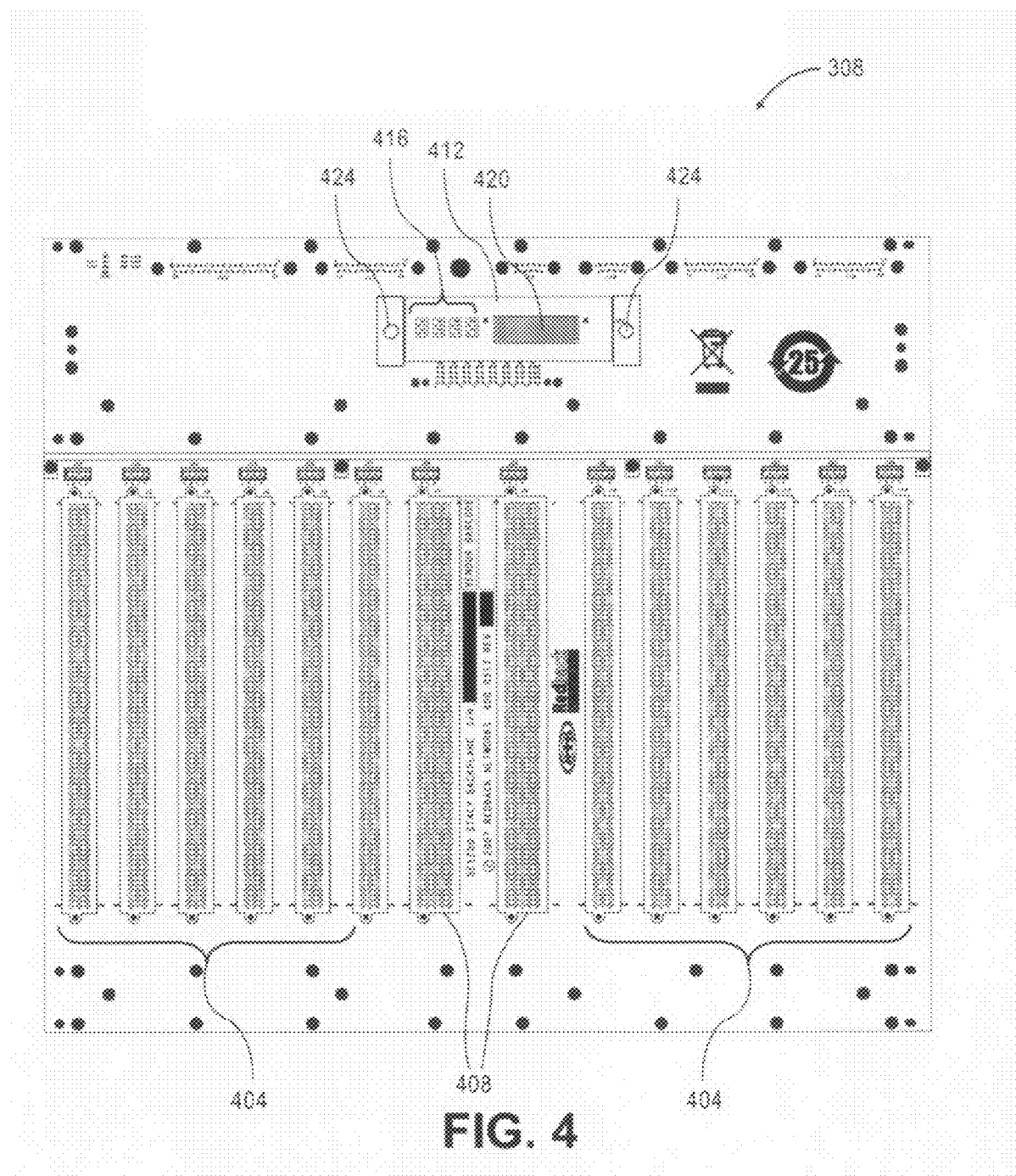
FIG. 4 is a front view of a back plane in accordance with one embodiment of the invention.

FIG. 4 is a detailed front view of the backplane 308 of FIG. 3.

The backplane 308 includes first connectors 404, second connectors 408 and a third connector 412. Each of the connectors 404, 408, 412 include electrical contacts for electrically coupling the connectors 404, 408, 412 with corresponding electrical contacts of connectors of the PCBs. The connectors 404, 408 are configured to be connected with the PCBs in the first opening 108 of the enclosure 104.

The third connector 412 includes first connection elements 416 a second connection element 420 and third connection elements 424. The first connection elements 416 are configured to be power connectors. The second connection element 420 is configured to be a signal connector. The second connection element 420 includes electrical contacts for electrically coupling the connector 412 with the corresponding contacts of the corresponding connector of the fan unit 112. In one embodiment, the third connection elements 424 are guide pins to assist in connection of the contacts of the connection elements 416 and 420 with the contacts of its corresponding connector. It will be appreciated that the connectors 404, 408 and 412 may vary from that illustrated in FIG. 4. For example, the connectors 404, 408, 412 may have different configurations, be of different sizes, or different numbers of connectors may be used.

Figure 5:
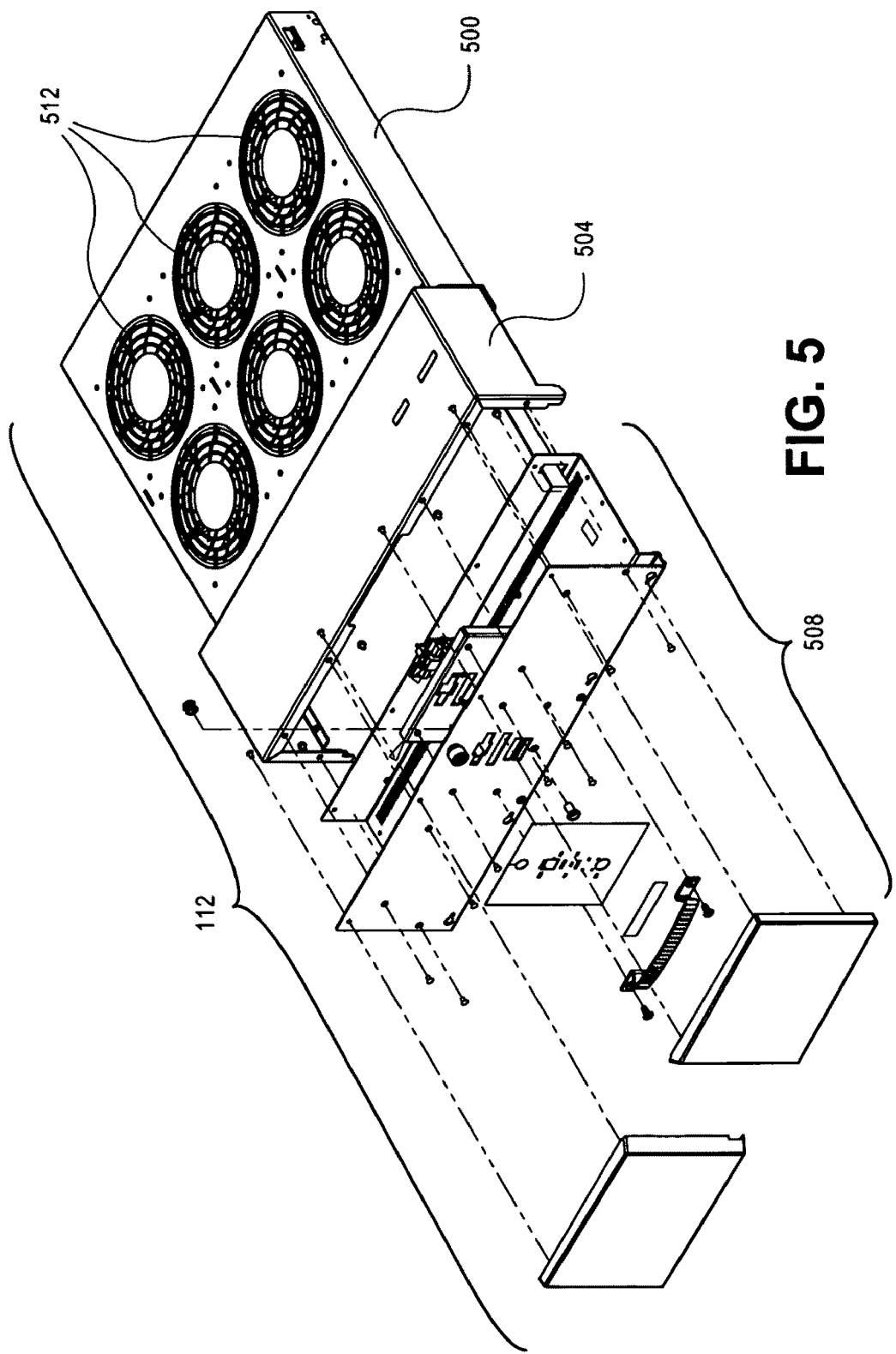
FIG. 5 is a perspective assembly view of a fan unit in accordance with one embodiment of the invention.
Figure 6:
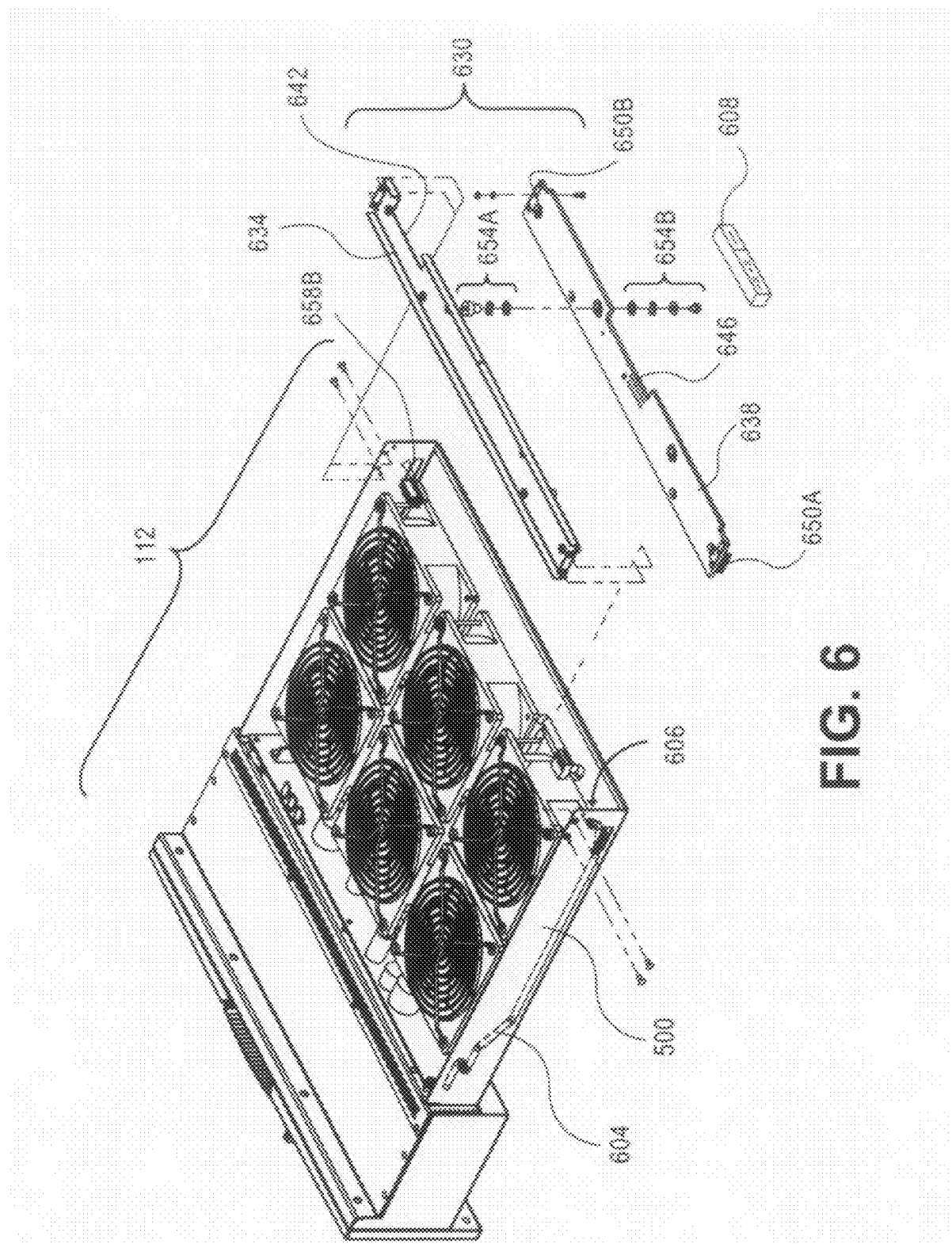
FIG. 6 is a rear perspective assembly view of the fan unit of FIG. 5 in accordance with one embodiment of the invention.

FIGS. 5-8 illustrate the fan unit in further detail. As shown in FIG. 5, the fan unit 112 includes a support 500, a panel enclosure 504, a panel 508, and fans 512. As shown in FIG. 6, the fan unit 112 also includes a wire harness 604, a connector 608 and an interface 630. The connector 608 is coupled with the interface 630. The interface 630 is coupled with the support 500. In one embodiment, the interface 630 is a printed circuit board (PCB) for the fan unit 112. Additional printed circuit boards may be provided in other portions of the fan unit 112.

In one embodiment, the wire harness 604 is configured to electrically couple the interface 630 with the fan tray controller of the fan unit 112.

In one embodiment, the connector 608 corresponds with the connector 412. For example, connector 608 and connector 412 together may be a mating connector set.

The fan unit 112 also includes a coarse alignment system 606. The alignment system 606 is shown in further detail in FIG. 7. The alignment system 606 includes a guide path 710, which is a slot or opening in the second opening 208 of enclosure 104. The illustrated guide path 710 includes an extended longitudinal path 712 and an angled path 716.

The alignment system 606 also includes a protrusion 720 that is provided on an external surface of the support 500. The protrusion 720 is sized to fit within the guide path 710. When the fan unit 112 is inserted into the second opening 208 of the enclosure 104, the protrusion 720 enters the guide path 710. As the fan unit 112 is pushed into the enclosure 104, the protrusion 720 slides, first, along the angled path 716 and then through the extended longitudinal path 712. The alignment system 606 aligns the fan unit 112 in the enclosure, such that the connector 608 of the fan unit 112 is generally aligned with the connector 412 of the backplane 308. In one embodiment, the alignment system 606 pre-centers and provides initial coarse alignment of the connector 608 relative to the connector 412, while limiting vertical and horizontal movement created by the floating aspect of the connector. Horizontal play of support 500 is restricted by grounding bumps 724 which make contact upon insertion of support 500 into the system chassis 100.

Figure 7:
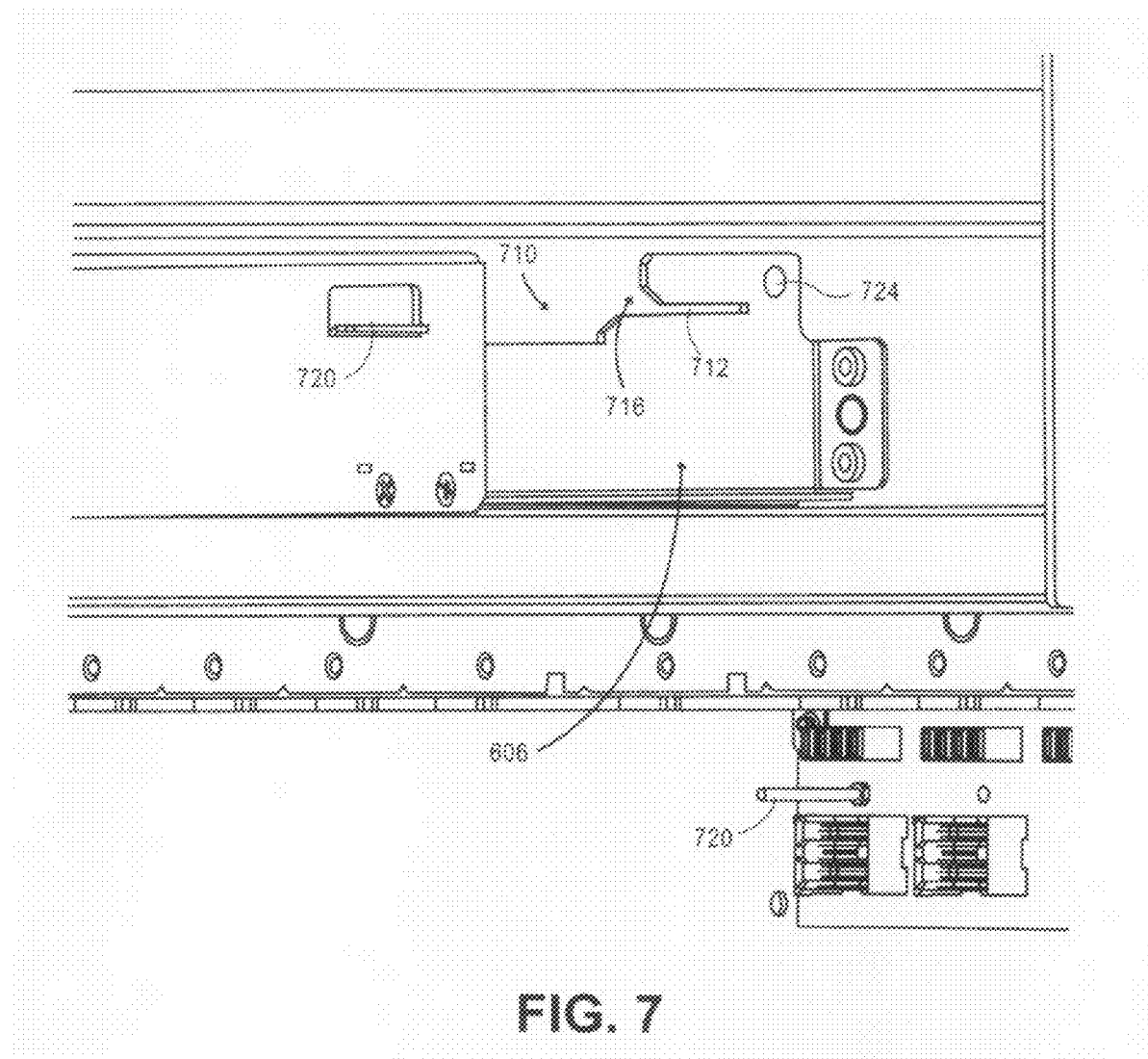
FIG. 7 is a schematic view of an alignment system of the fan unit of FIG. 5 and chassis of FIG. 1 in accordance with one embodiment of the invention.

It will be appreciated that the configuration of the alignment system 606 may vary from that illustrated in FIGS. 6 and 7. It will also be appreciated that the guide path 710 may be provided on the fan unit 112, with the protrusion 720 provided in the enclosure 104. It will also be appreciated that other methods for aligning the fan unit 112 in the enclosure 104 may be provided or no alignment need be provided. For example, a rail system may be provided along a substantially long portion of the length of the fan unit (e.g., more than half of the length of the fan unit 112). It will also be appreciated that the alignment system 606 may be provided on only one side or on both sides of the fan unit 112/enclosure 104.

Figure 8:
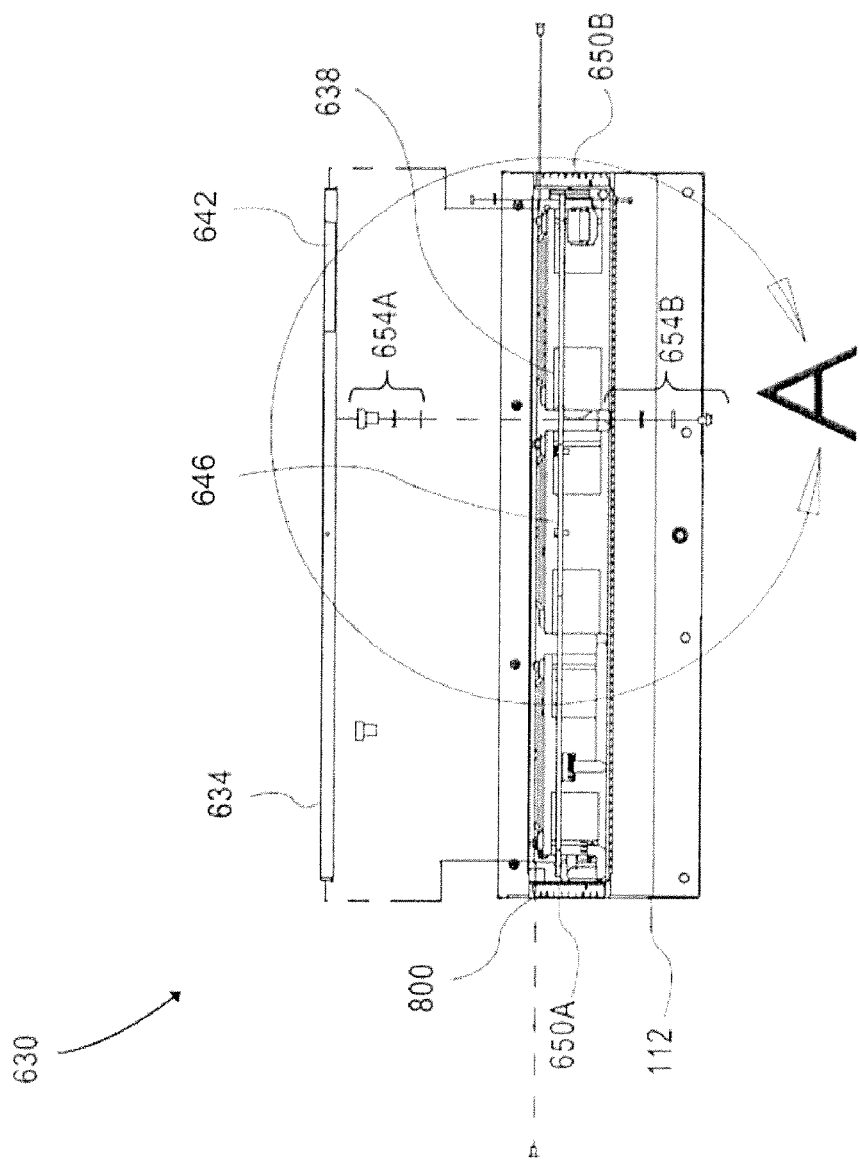
FIG. 8 is a rear end view of the fan unit of FIG. 5 in accordance with one embodiment of the invention.

Referring to FIGS. 6 and 8, the interface 630 is shown in further detail. As described above, the connector 608 is coupled with the interface 630. In one embodiment, electrical conductors, such as wires, are provided on the interface 630 to connect the interface 630 with the display panel 304 and/or other PCBs in the fan unit 112 (e.g., via the wire harness 604).

The interface 630 includes a first support 634 and a second support 638. In one embodiment, the second support 638 is a printed circuit board. The first support 634 includes a first cut-away portion 642 and the second support 638 includes a second cut-away portion 646. It will be appreciated that in certain embodiments the cut-away portion 642 and/or cut-away portion 646 need not be provided in the supports 634, 638.

The first support 634 is configured to be coupled with an upper portion of the side surfaces of the support 500. The second support 638 is coupled with the first support 634. In embodiments in which the fan unit 112 is a tray, the first support 634 may be an independent component attached to the support 500. In embodiments in which the fan unit 112 is an enclosure, the first support 634 may be an upper surface of the enclosure.

In one embodiment, the cut-away portion 642 is configured to accommodate the topology of the support 638. In one embodiment, the cut-away portion 646 is configured to accommodate the stance of the connector 608. As described above, the cut-away portions 642, 646 need not be provided and/or the cut-away portions 642, 646 may vary from that illustrated in the figures.

First and second horizontal spring assemblies 650a, 650b (collectively, horizontal springs 650), respectively, are provided on opposing ends of the second support 638. The horizontal spring assemblies 650a, 650b are coupled with the support 638 and the support 500. The horizontal springs 650 are configured to provide a horizontal force on the support 638 to provide horizontal resiliency to the connector 608.

First and second vertical spring assemblies 654a, 654b (collectively, vertical springs 654), respectively, are also provided on opposing surfaces of the second support 638. The first vertical spring assembly 654a is coupled with the first support 634 and the second vertical spring assembly 654b is coupled with an opposing surface of the second support 638. The vertical springs 654 are configured to provide a vertical force on the support 638 to provide vertical resiliency to the connector 608.

Although one vertical spring 654 is shown in FIG. 6, it will be appreciated that more than one vertical spring may be provided. For example, two vertical springs, one on either side of the connector 608 may be provided. In another example, six vertical springs evenly spaced along the length of the support 638 may be provided.

In one embodiment, the springs 650 and/or 654 electrically ground the PCB of support 638 to the support 500 or the chassis 100 to ground the fan unit 112 to the chassis 100.

When the fan unit 112 is inserted into the chassis 100, the connector 608 of the fan unit 112 is coupled with the connector 412 of the backplane 308. The alignment system 606 may be used to generally align and pre-center the connector 608. In addition, the horizontal springs 650 can provide a pre-centering horizontal force to the connector 608. Similarly, the vertical springs 654 can provide a pre-centering vertical force to the connector 608. By aligning and pre-centering the connector 608, stubbing of guide pins of the connector 412 on the connector 608 can be eliminated.

When the connector 608 is to be connected with the connector 412, the horizontal springs 650 can provide a horizontal force, if needed, to the connector 608 to aid in horizontally aligning the connectors 608, 412. Similarly, the vertical springs 654 can provide a vertical force, if needed, to the connector 608 to aid in vertically aligning the connectors 608, 412.

In certain embodiments, the interface 630 allows the connector 608 to float. The interface 630 also removes the weight of the fan unit 112 from the connector 608. The interface 630 can also be used to electrically ground the fan unit 112.

In addition, the interface 630 improves the electrical connection between the back plane connector 412 and fan unit connector 608. This improved connection helps to prevent failure resulting from a poor connection. The interface 630 also prevents fire that can be associated with the poor connection. Furthermore, the interface 630 also reduces the risk of damage to the contacts on the connectors 412, 608.

Figure 9:
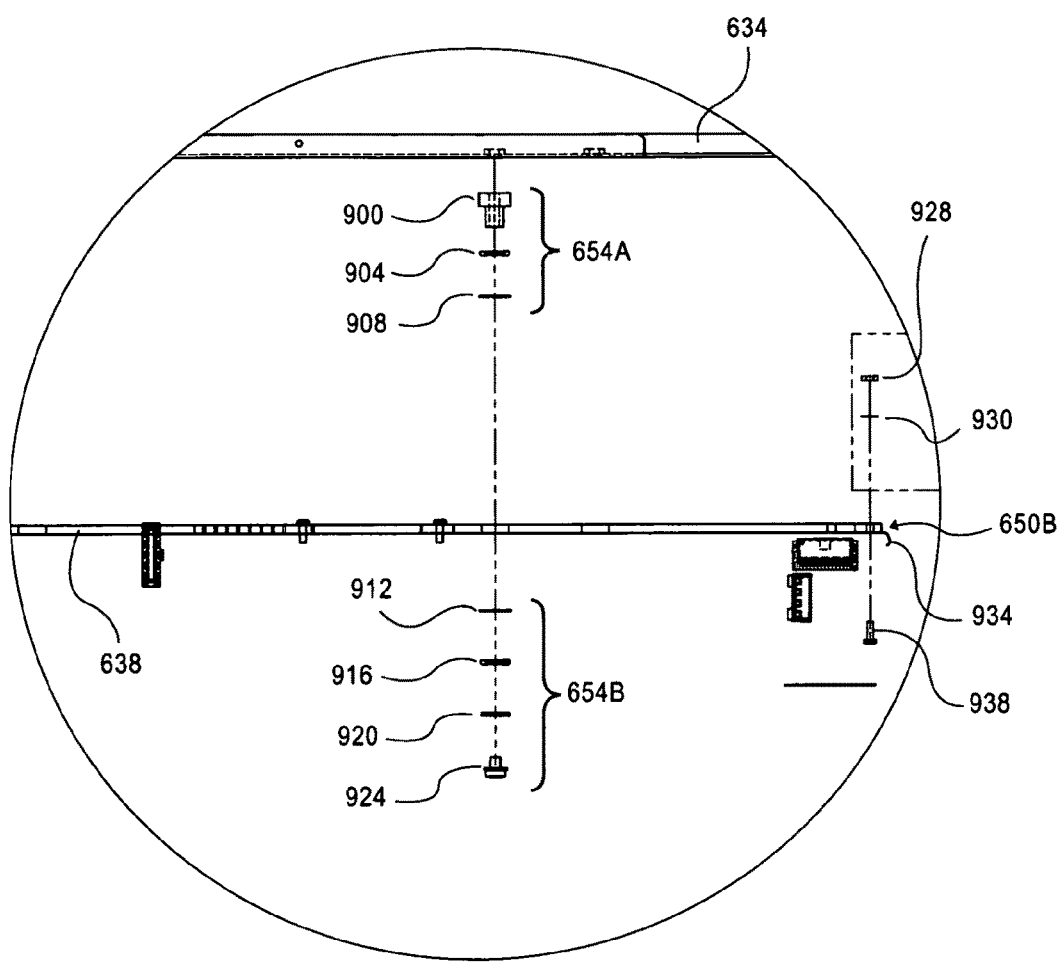
FIG. 9 is a detailed assembly end view of connection springs in accordance with one embodiment of the invention.
Figure 10:
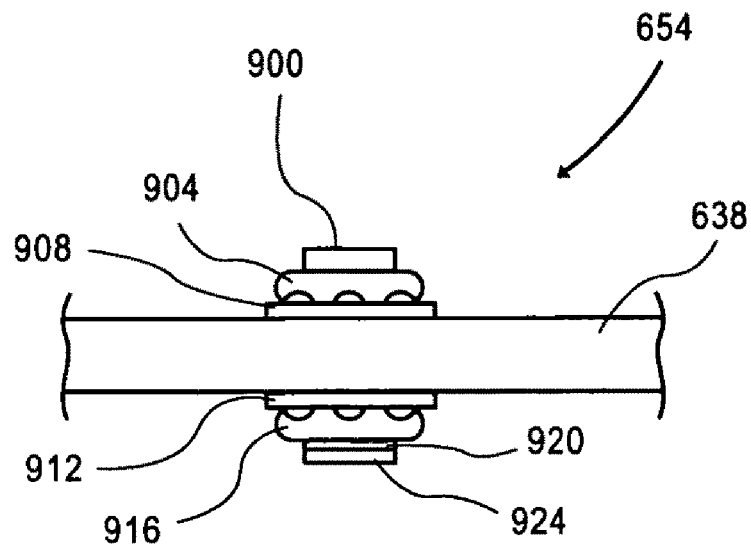
FIG. 10 is a detailed view of a vertical connection spring in accordance with one embodiment of the invention.
Figure 11:
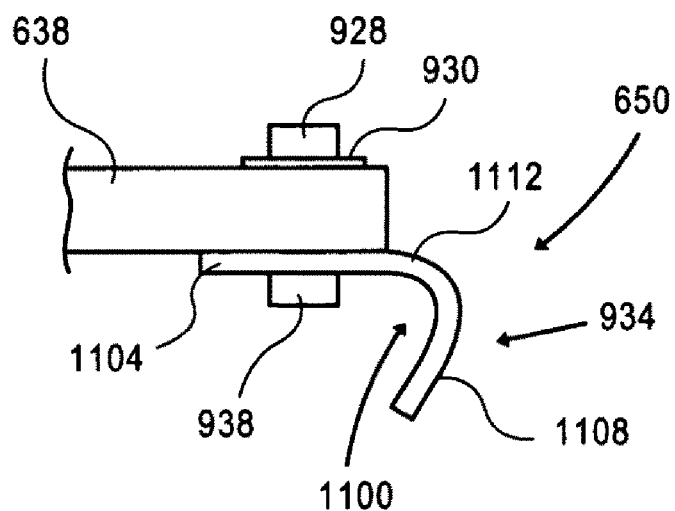
FIG. 11 is a detailed view of a horizontal connection spring in accordance with one embodiment of the invention.

FIG. 9 is a detailed cross-sectional assembly view illustrating the springs 650, 654 in further detail. FIGS. 10 and 11 also illustrate the vertical springs 654 and horizontal springs 650, respectively.

Referring to FIGS. 9 and 10, the first vertical spring assembly 654a includes a shoulder standoff 900, a spring washer 904, and a flat washer 908. The second vertical spring assembly 654b includes a flat washer 912, a spring washer 916, a flat washer 920 and a screw 924. The screw 924 is configured to fix the standoff 900 to the support 634, about which the support 638 translates up and down (i.e., vertical float). The spring washer 916 is configured to vertically compress or expand.

In one embodiment the washer 904 is a Belleville washer. It will be appreciated that the spring washer 904 may alternatively be a cupped spring washer or other non-flat washer.

Multiple spring washers may also be stacked to modify the amount of force provided by the vertical springs 654. The spring washers may be stacked in parallel or in series. For example, when the washers are stacked in parallel (e.g., stacked in the same direction), the spring constant of the springs 654 increases; however, when the spring washers are stacked in series (e.g., stacked in alternating directions), the spring constant of the springs 654 decreases. It will be appreciated that a combination of washers stacked in parallel and in series may be used to provide a desired spring constant.

It will be appreciated that the vertical force need not be provided by a spring washer; other spring systems may be used to provide vertical resiliency to the connector. For example, helical springs, coiled springs, leaf springs, gas springs, cantilever springs, and the like, and combinations thereof, may be used to provide the vertical force.

In addition, it will be appreciated that the vertical force can be provided on only one side of the support 638. For example, only vertical spring 654b can be provided to provide the vertical force to the support 638. It will be appreciated that the first support 634 need not be provided if only vertical spring 654b is provided.

It will also be appreciated that the openings in the first support 634, second support 638 and/or bottom surface of the support 500 should be sufficiently large to allow for some horizontal movement of the vertical springs 654.

Referring to FIGS. 9 and 11, the horizontal springs 650 each include a nut 928, washer 930, spring 934 and bolt 938. In the illustrated embodiment, the spring 934 is a bracket 1100.

As shown in FIG. 11, the bracket 1100 includes a first flat portion 1104, a second flat portion 1108 and a curved portion 1112 between the flat portions 1104, 1108. The flat portion 1104 is coupled with the support 638. The curved portion 1112 is in contact with a side surface of the support 500. It will be appreciated that in some embodiments the flat portion 1108 may be in contact with the side surface of the support 500. The curved portion 1112 is configured to engage with the side surface of the support 500 in a wiping action. This wiping action, or rotation, of the curved portion 1112 relative to the support 500 allows for horizontal deflection of the connector 608.

In one embodiment, the flat portion 1104 is fastened to the support 638 and the flat portion 1108 is not fastened to a side surface of the support 500. It will be appreciated that in another embodiment that the flat portion 1108 can be fastened to the side surface of the support. In such an embodiment, an opening should be provided in the flat portion 1108 that is sufficiently large to allow for vertical movement if needed.

The vertical bracket 1100 may be made of a metal that is sufficiently thin to allow for some deflection of the flat portions 1104, 1108 relative to one another. It will be appreciated that the flexible bracket can be made of other materials, such as plastics or composite materials. It will be appreciated, however, that plastics or composites can be used if electrical contact through the bracket 1100 is not required. It will also be appreciated that electrically conductive plastics or composite materials (e.g., plastics or composite materials having carbon fibers) can be used if electrical contact through the bracket 1100 is required. In one embodiment, the thickness of the curved portion 1112 is less than the thickness of the flat portions 1104, 1108 to provide the relative deflection.

In another embodiment, the flat portions 1108 of the brackets 1100 (i.e., springs 650a, 650b) are inserted into respective openings 658a, 658b provided in the support 500. The flat portions 1104 and curved portion 1112 may be moved through the openings 658a, 658b to provide the horizontal deflection. The bracket 1100 may be a metal, plastic, composite or other similar material.

It will be appreciated that in other embodiments, the spring 934 may be a cantilever spring, helical spring, leaf spring, gas spring or the like or combinations thereof. Any spring or other device that can provide a horizontal deflection of the connector 608 may be used.

The force exerted by the horizontal and/or vertical springs 650, 654 should be sufficiently light to allow the connector to float, but firm enough to provide a good connection between the connector of the fan unit and the connector of the backplane and a good connection between the PCB of support 638 and the support 500 or chassis 100. For example, the maximum force provided by the springs 650, 654 may be about 3-4 pounds. It will be appreciated that the maximum force provided by the springs 650, 654 may be less than about 3 pounds or greater than about 4 pounds.

Although both springs 650, 654 are illustrated as being fastened to the interface and enclosure by a nut and bolt system, it will be appreciated that alternative fasteners can be used to connect the interface with the fan unit. For example, cap screws, rivets, roll pins, pinned shafts, or other similar fasteners may be used. In another example, the springs 650, 654 may be fastened by welding, soldering, brazing and the like. In yet another example, the springs 650, 654 may be fastened with an adhesive. It will be appreciated that various combinations of the above fastening methods or other fastening methods may be used.

Figures 12, 13:
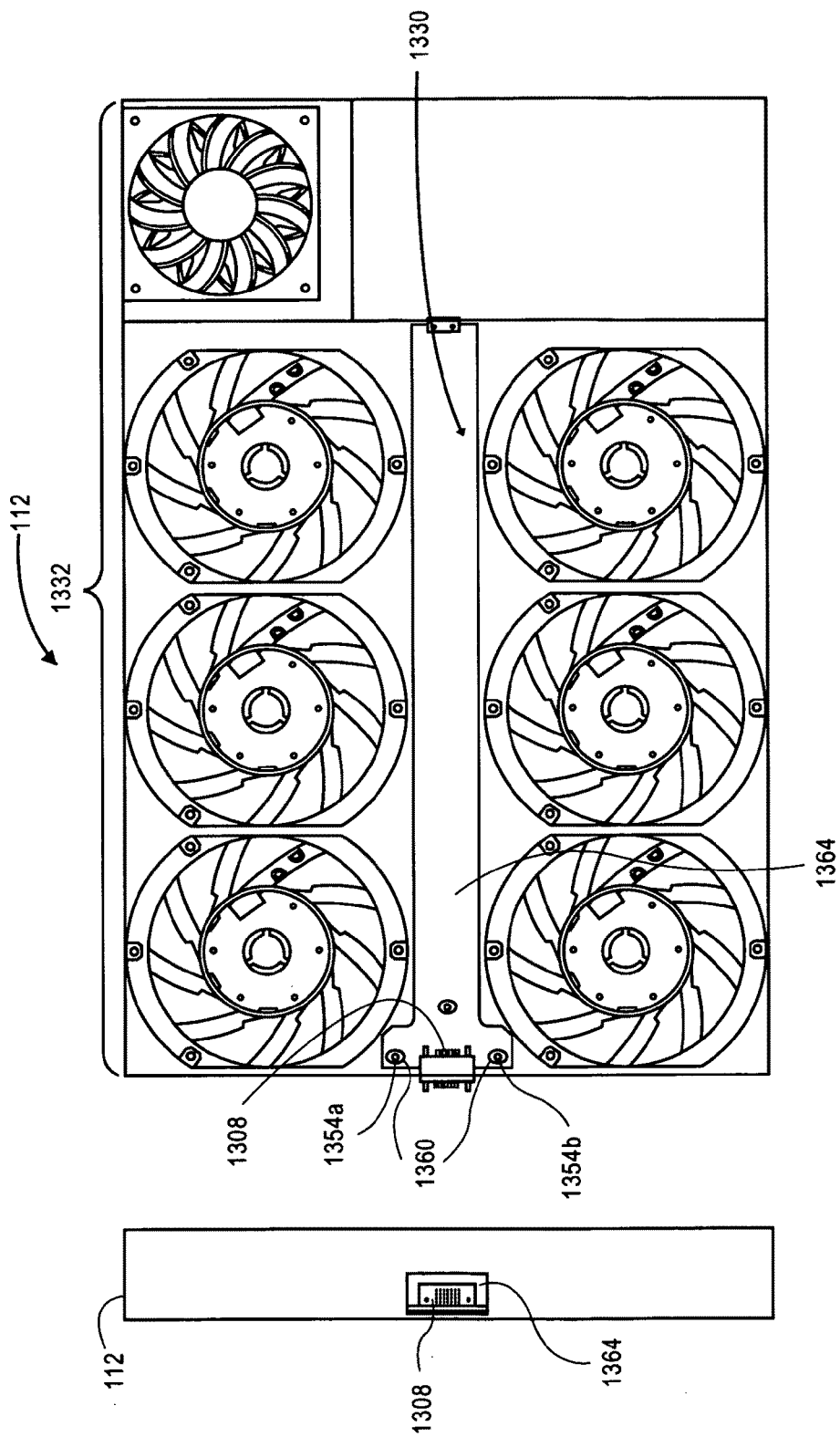
FIG. 12 is a top view of a fan unit in accordance with another embodiment of the invention.
FIG. 13 is an end view of the fan unit of FIG. 12.

FIGS. 12 and 13 illustrate the fan unit 112 in accordance with another embodiment of the invention. In FIG. 12, the interface 1330 extends along the depth 1332 of the fan unit 112. Vertical springs 1354a, 1354b are provided on either side of a connector 1308. The openings 1360 for each vertical spring 1354 are sufficiently large to allow for horizontal movement of the interface board 1364. In FIGS. 12 and 13, the fan controller is integrated into the PCB of the interface 1330.

Figure 14:
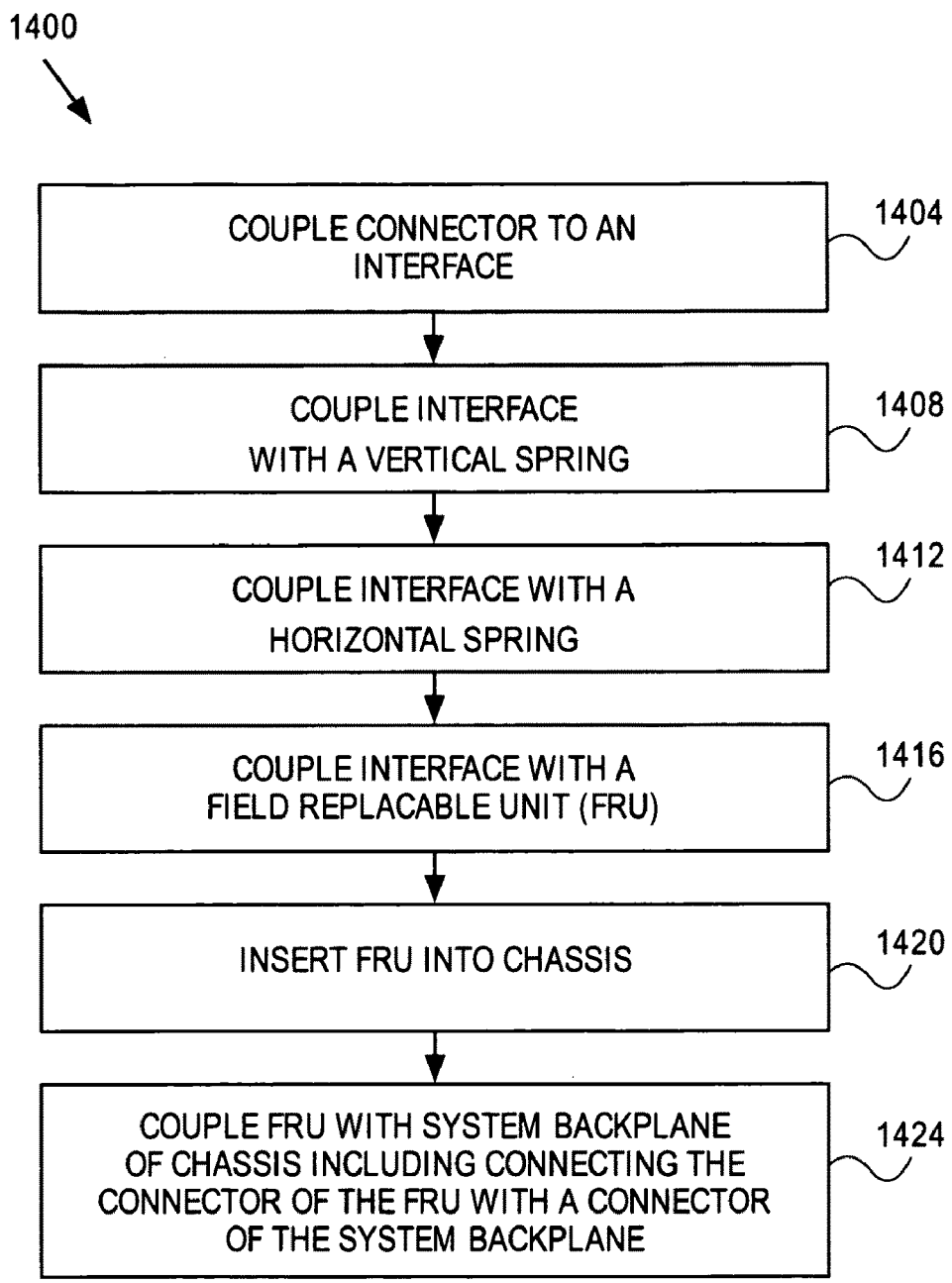
FIG. 14 is a flow chard of a process for connecting the fan unit of FIG. 5 with the back plane of FIG. 4 in accordance with one embodiment of the invention.

FIG. 14 is a block diagram illustrating a method 1400 of connecting the interface of the fan unit with the backplane.

The method 1400 begins by coupling a connector to an interface 1104. For example, the connector 608 is connected to the second support 638 of the interface 630.

The method continues by coupling the interface with a vertical spring 1408. For example, vertical springs 654 are coupled with the interface 630.

The method 1400 continues by coupling the interface with a horizontal spring 1412. For example, horizontal springs 650 are coupled with the interface 630.

The method 1400 continues by coupling the interface with a field replaceable unit (FRU) 1416. For example, vertical springs 654, horizontal springs and first support 634 are coupled with the support 500 of fan unit 112.

The method 1400 continues by inserting the FRU into a chassis 1420. For example, the fan unit 112 is inserted into the chassis 100 of FIG. 1.

The FRU is coupled with the system back plane of the chassis including connecting the connector of the FRU with a connector of the system backplane 1424. For example, the connector 608 of the fan unit 112 is connected with the connector 412 of the backplane 308. The vertical springs 654 and horizontal springs 650 may provide vertical and horizontal deflection, respectively, of the connector 608 relative to the connector 412, as needed for connection.

It will be appreciated that the order of steps can vary in the method 1400. For example, the supports can be coupled with the FRU and the springs coupled to the supports after coupling the supports with the FRU. Similarly, the horizontally spring(s) can be couple before the vertically spring(s). In addition, the method 1400 may include fewer or a greater number of steps. For example, the method 1400 may also include aligning the connector of the FRU with the connector of the backplane before connecting the connectors.

Although the method 1400 is described as connecting a FRU connector with a connector on a backplane, it will be appreciated that the connector need not be on the backplane. The method can be used to couple a connector of an FRU with any connector within the chassis 100.

Although the connector 608 is generally described as being centered relative to the connector 412, it will be appreciated that the connectors 608, 412 need not be provided at a central location. For example, the connectors 608, 412 can be offset to a side. It will be appreciated that the vertical and horizontal springs and/or alignment system can be used to improve connection between these connectors that are offset to a side as well.

Additional advantages of embodiments of the present invention include that low-cost, easily obtainable parts can be used to provide a grounded PCB, floating PCB/connector that takes the weight of the FRU off of a mated connector set, while still maintaining electrical continuity between the PCB and chassis. Other advantages include the reduction or elimination of stubbed pins, damaged backplanes, damage from the weight of the FRU.

It will be appreciated that embodiments of the present invention provide a method of left-to-right, up-down float of a right angle connector set via low cost, high accuracy screw-machined parts and have chassis grounding provisions. Embodiments of the invention also allow the use of connectors having more signal pins.

The foregoing description with attached drawings is only illustrative of possible embodiments of the described method and should only be construed as such. Other persons of ordinary skill in the art will realize that many other specific embodiments pare possible that fall within the scope and spirit of the present idea. The scope of the invention is indicated by the following claims rather than by the foregoing description. Any and all modifications which come within the meaning and range of equivalency of the following claims are to be considered within their scope.

The invention claimed is:

1. A system comprising:
a chassis having a first connector;

a field replaceable unit insertable into the chassis;
an interface coupled with the field replaceable unit by a set of one or more springs; and
a second connector coupled with the interface, the first connector coupleable with the second connector, the second connector being vertically and horizontally resiliently deflectable relative to the first connector by the set of springs.

2. The system of claim 1, wherein the interface is coupled with the field replaceable unit by a first spring at a first end of the interface and a second spring at a second end of the interface.

3. The system of claim 2, wherein the first spring and the second spring comprise a flexible bracket.

4. The system of claim 1, wherein the interface is coupled with the field replaceable unit by a first spring on a first side of the interface and a second spring on a second side of the interface.

5. The system of claim 4, wherein the first spring and the second spring comprise a spring washer.

6. The system of claim 1, wherein the second connector is self-aligning with the first connector.

7. The system of claim 1, wherein the second connector is self-biasing relative to the first connector.

8. The system of claim 1, wherein the chassis comprises a backplane, the first connector being connected with the backplane.

9. The system of claim 1, wherein the field replaceable unit comprises a fan unit.

10. The system of claim 1, wherein the field replaceable unit comprises a guide path and the chassis comprises a guide pin, the guide pin engageable with the guide path.

11. The system of claim 1, wherein the chassis comprises a guide path and the field replaceable unit comprises a guide pin, the guide pin engageable with the guide path.

12. The system of claim 1, wherein the second connector is self-locating relative to the first connector.

13. The system of claim 1, wherein the second connector is a floating connector.

14. The system of claim 1, wherein the second connector is self-aligning relative to the first connector.

15. A system comprising:
a support;
an interface including a printed circuit board;
a first connector coupled with the interface to electrically couple the printed circuit board with a second connector;
a horizontal spring to couple the interface with the support and provide horizontal resilience to the first connector; and
a vertical spring to couple the interface with the support and provide vertical resilience to the first connector.

16. The system of claim 15, wherein the horizontal spring comprises a first horizontal spring at a first end of the interface and a second horizontal spring at a second end of the interface.

17. The system of claim 16, wherein the first horizontal spring and the second horizontal spring each comprise a flexible bracket.

18. The system of claim 15, wherein the vertical spring comprises a first vertical spring on a first side of the interface and a second vertical spring on a second side of the interface.

19. The system of claim 18, wherein the first vertical spring and second vertical spring each comprise a spring washer.

20. The system of claim 18, wherein the first vertical spring and second vertical spring each comprise a plurality of spring washers.

21. The system of claim 15, wherein the first connector is a self-locating connector.

22. The system of claim 15, wherein the first connector is a floating connector.

23. The system of claim 15, wherein the first connector is a self-aligning connector.

* * * * *

UNITED STATES PATENT AND TRADEMARK OFFICE
CERTIFICATE OF CORRECTION

| | | |
|---|---|---|
| PATENT NO. | : 8,025,515 B2 | Page 1 of 1 |
| APPLICATION NO. | : 12/069256 | |
| DATED | : September 27, 2011 | |
| INVENTOR(S) | : Diaz | |

It is certified that error appears in the above-identified patent and that said Letters Patent is hereby corrected as shown below:

In Column 2, Line 21, delete "chard" and insert -- chart --, therefor.

In Column 8, Line 59, delete "pare" and insert -- are --, therefor.

Signed and Sealed this
Fourteenth Day of February, 2012

David J. Kappos
*Director of the United States Patent and Trademark Office*